United States Patent
Toyoda et al.

(10) Patent No.: US 6,794,857 B2
(45) Date of Patent: Sep. 21, 2004

(54) APPARATUS AND METHOD FOR MEASURING A PHASE DELAY CHARACTERISTIC

(75) Inventors: Seiji Toyoda, Tokyo (JP); Emiko Fujiwara, Tokyo (JP)

(73) Assignee: Ando Electric Co. Ltd., Tokyo (JP)

( * ) Notice: Subject to any disclaimer, the term of this patent is extended or adjusted under 35 U.S.C. 154(b) by 2 days.

(21) Appl. No.: 10/235,529

(22) Filed: Sep. 5, 2002

(65) Prior Publication Data

US 2003/0057965 A1 Mar. 27, 2003

(30) Foreign Application Priority Data

Sep. 25, 2001 (JP) .................................... P.2001-291978

(51) Int. Cl.[7] ............................................ G01R 25/00
(52) U.S. Cl. ................ 324/76.78; 324/76.77; 324/617
(58) Field of Search .......................... 324/76.77, 76.78, 324/622, 633, 710, 76.52, 617

(56) References Cited

U.S. PATENT DOCUMENTS 4,933,916 A * 6/1990 May et al. .................. 367/125

\* cited by examiner

*Primary Examiner*—N. Le
*Assistant Examiner*—Donald M. Lair
(74) *Attorney, Agent, or Firm*—Fish & Richardson PC

(57) ABSTRACT

A phase delay characteristic measuring apparatus includes an in-phase component calculating means for outputting a correlation value between input sampling data of the input signal and the output signal and ideal sine waveform data as a baseband I signal (in-phase component), a quadrature component calculating means for outputting a correlation value between the input sampling data of the input signal and the output signal and ideal cosine waveform data as a baseband Q signal (quadrature component), a phase angle calculating means for outputting phase angles of the input signal and the output signal based on the baseband I signal and the baseband Q signal, and a phase delay calculating means for calculating an amount of phase delay of the tested device from the phase angles of the input signal and the output signal.

8 Claims, 4 Drawing Sheets

APPARATUS AND METHOD FOR MEASURING A PHASE DELAY CHARACTERISTIC

BACKGROUND OF THE INVENTION

1. Field of the Invention

The present invention relates to a measuring apparatus and a measuring method that are less subjected to influences of the noise, the spurious, etc. with a simple configuration when a phase delay characteristic between an input signal and an output signal of a measured device such as an optical communication component, or the like is measured.

2. Description of the Related Art

The conventional apparatus of this type for measuring the phase delay characteristic between the input signal and the output signal of the measured device such as the optical communication component, or the like, is described in the following.

FIGS. 4A and 4B are views for explaining the principle of the phase measuring portion to measure the phase delay characteristic in the prior art. FIG. 4A is a block diagram showing a configuration of a portion and FIG. 4B is a waveform diagram for explaining the principle of the portion.

In FIG. 4A, the ALC or the limiter amplifiers 41-1, 41-2 shape a reference signal (IF-R signal) and a signal that is passed through the tested device, i.e., a measured signal (IF-A/B signal) into pulse waveforms shown in FIG. 4B respectively to output the pulse signals. Then, the threshold detecting circuits 42-1, 42-2 detect rising time points of the reference signal (IF-R signal) and the measured signal (IF-A/B signal) respectively, and then provide them to the phase-difference comparing means (counter) to measure the phase difference between them.

In this phase-difference comparing means, the phase difference can be measured by counting the number of clocks between the leading edge of the reference signal (IF-R signal) and the leading edge of the measured signal (IF-A/B signal).

The principle of this apparatus is simple, but the signal purity of the oscillator that generates the reference signal, the characteristic of the employed parts, etc. affect the measurement error. Thus, the signal purity of the oscillator is very critical to implement the high-accuracy measurement.

Also, in order to time the phase difference with high accuracy, there is a problem that the clock signal of the extremely high frequency must be supplied to the counter.

FIG. 5 are views for explaining the principle of another phase measurement to measure the phase delay characteristic in the prior art.

In FIG. 5, the amplifiers 51-1, 51-2 provides the reference signal (IF-R signal) and the signal that is passed through the tested device, i.e., the measured signal (IF-A/B signal) to the synchronous detector 53 that detects the baseband I signal (in-phase component) and the baseband Q signal (quadrature component) as the detected outputs.

The baseband I signal (in-phase component) and the baseband Q signal (quadrature component) are output as the time-series data, and are output as phase difference time-series data based on the arc tan calculation in the phase-difference calculating circuit 54.

Then, the phase-difference signal given as the time series data are equalized by the equalization 55, and thus the phase-difference between the reference signal (IF-R signal) and the measured signal (IF-A/B signal) can be derived as the measured result.

In this case, as shown in an elliptic circle of FIG. 4, the calculation in the synchronous detector 53, the baseband I signal (in-phase component), is obtained by multiplying the reference signal (IF-R signal) and the measured signal (IF-A/B signal) by virtue of the multiplying circuit 531-1 and passing the resultant signal through the low-pass filter (LPF) 533-1.

Also, the baseband Q signal (quadrature component) is obtained by multiplying the signal, whose phase is shifted from the reference signal (IF-R signal) by 90 degrees by phase converter 532, and the measured signal (IF-A/B signal) by virtue of multiplying circuit 531-2 and passing the resultant signal through the low-pass filter (LPF) 533-2.

In this apparatus, it is possible to construct the apparatus by either the hardware or the software.

In the case where the apparatus is constructed by the software, the AD converter circuit and the sampling circuit are needed, and the phase difference can be measured with relatively high accuracy even if the sampling is carried out based on the low-speed clock. However, since the measured result is output as the time series data, such measured result is readily affected by the noise, and thus various measures are needed such that the LPF provided after the synchronous detection must be set to the narrower bandwidth, the measured results that are taken plural times must be averaged, or the like.

Then, these measures bring about an increase in the measuring time and also put a limit on the higher accuracy.

SUMMARY OF THE INVENTION

It is an object of the present invention to provide a measuring apparatus and a measuring method capable of measuring a phase delay characteristic between an input signal and an output signal of a measured device at high speed, with high accuracy and at low cost without influences of the noise, the spurious, etc.

In order to overcome the above subject, according to the present invention, there is provided a phase delay characteristic measuring apparatus for measuring a phase delay of a tested device based on phases of an input signal input into the tested device and an output signal output from the tested device, comprising:

an in-phase component calculating means for outputting a correlation value between input sampling data of the input signal and the output signal and ideal sine waveform data as a baseband I signal (in-phase component);

a quadrature component calculating means for outputting a correlation value between the input sampling data of the input signal and the output signal and ideal cosine waveform data as a baseband Q signal (quadrature component);

a phase angle calculating means for outputting phase angles of the input signal and the output signal based on the baseband I signal (in-phase component) and the baseband Q signal (quadrature component); and a phase delay calculating means for calculating an amount of phase delay of the tested device from the phase angles of the input signal and the output signal.

According to this configuration, when the phase delay characteristic between the input signal and the output signal of the tested device is measured, the measuring apparatus that can execute the measurement at high speed with high accuracy at low cost without the influence of the noise, the spurious, etc. can be provided.

Also, in the in-phase component calculating means and the quadrature component calculating means, a calculation of .a(n).b(n)

where a(n): input sampling data, and b(n): ideal sine waveform data or ideal cosine waveform data is executed by DSP.

Also, samplings of the input signal and the output signal are carried out over m periods (m=integer), respectively.

Also, a reference input signal and waveform data whose phase is shifted by 90 from the reference input signal by DSP are used in place of the ideal sine waveform data or the ideal cosine waveform data.

Also, the input signal and the output signal, which are to be sampled, are IF signals that are subjected to RF-IF conversion.

Also, a phase delay characteristic measuring method of measuring a phase delay of a tested device based on phases of an input signal input into the tested device and an output signal output from the tested device, comprising:

an in-phase component calculating step of outputting a correlation value between input sampling data of the input signal and the output signal and ideal sine waveform data as a baseband I signal (in-phase component);

a quadrature component calculating step of outputting a correlation value between the input sampling data of the input signal and the output signal and ideal cosine waveform data as a baseband Q signal (quadrature component);

a phase angle calculating step of outputting phase angles of the input signal and the output signal based on the baseband I signal (in-phase component) and the baseband Q signal (quadrature component); and a phase delay calculating step of calculating an amount of phase delay of the tested device from the phase angles of the input signal and the output signal.

Also, in the in-phase component calculating step and the quadrature component calculating step, a calculation of .a(n).b(n)

where a(n): input sampling data, and b(n): ideal sine waveform data or ideal cosine waveform data is executed by DSP.

Also, samplings of the input signal and the output signal are carried out over m periods (m=integer) respectively.

DETAILED DESCRIPTION OF THE PREFERRED EMBODIMENTS

A phase delay characteristic measuring apparatus and method of the present invention will be described with reference to the attached drawings hereinafter.

Figures 1A, 1B:
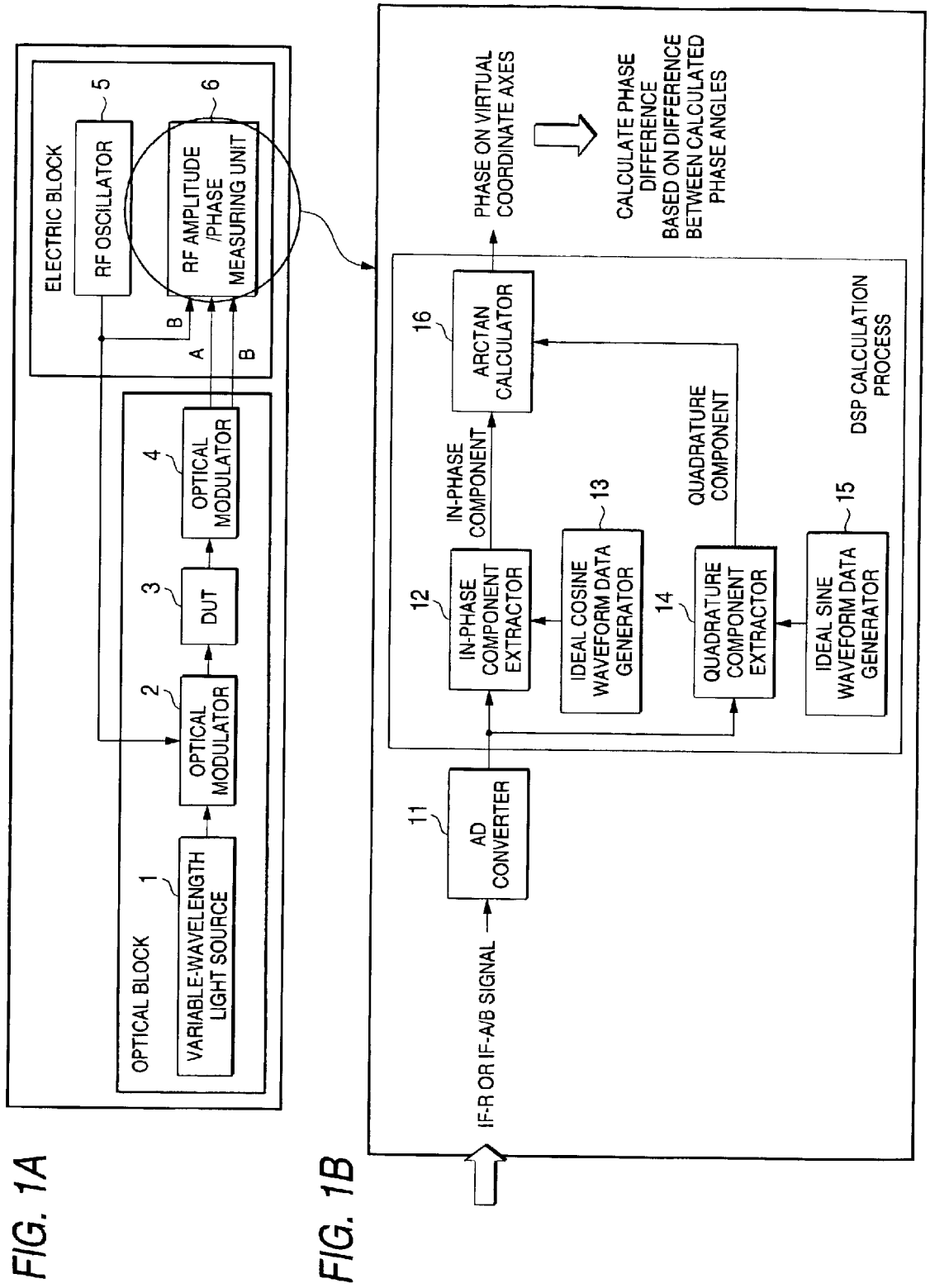
FIGS. 1A and 1B are views showing a configuration of a phase delay characteristic measuring apparatus of the present invention.

FIGS. 1A and 1B are views showing a configuration of a phase delay characteristic measuring apparatus of the present invention, wherein FIG. 1A shows an overall configuration and FIG. 1B shows a detailed configuration of the pertinent portion.

In FIG. 1A, reference numeral 1 is a variable-wavelength light source, 2 is an optical modulator, 3 is a DUT (device under test), 4 is an optical demodulator, 5 is a RF oscillator, and 6 is an RF amplitude/phase measuring device.

An output light of the variable-wavelength light source 1 is modulated by the optical modulator 2 based on a RF signal generated by the RF oscillator 5, and then input into the DUT 3.

Then, an output of the DUT is demodulated into the IF-R signal and the IF-A/B signal by the optical demodulator 4, and then these signals are compared with the above RF signal by the RF amplitude/phase measuring device 6 to measure the amplitude and the phase.

In this case, the configuration in FIG. 1 is shown as the configuration for measuring the delay of the light signal that is passed through the measured device. It is needless to say that the device that can pass through the electric signal may be employed as the measured device.

In a detailed configuration of the RF amplitude/phase measuring device shown in FIG. 1B, 11 is an AD converter, 12 is an in-phase component extractor, 13 is an ideal cosine waveform data generator, 14 is a quadrature component extractor, 15 is an ideal sine waveform data generator, and 16 is an arc tan calculator.

In this case, in FIGS. 1A and 1B, the local signal source and the mixer, which execute the RF-IF conversion, are omitted. The comparison in FIG. 1B is carried out by the IF after the conversion.

In FIG. 1B, the intermediate frequency signal, i.e., the IF-R signal or the IF-A/B signal, which is subjected to the RF-IF conversion, is converted into the digital signal by the AD converter 11, and then supplied to the in-phase component extractor 12 and the quadrature component extractor 14.

Also, ideal cosine waveform data and ideal sine waveform data, which are outputs of the ideal cosine waveform data generator 13 and the ideal sine waveform data generator 15 respectively, are supplied to the in-phase component extractor 12 and the quadrature component extractor 14 respectively.

Phases (phases on the virtual coordinate axes) of the in-phase component and the quadrature component, which are extracted by the in-phase component extractor 12 and the quadrature component extractor 14, are calculated by the arc tan calculator 16.

The phase difference between these signals (the phase delay of the output signal from the input signal of the tested device DUT) is calculated based on the difference between the phase angle of the calculated IF-R signal and the phase angle of the IF-A/B signal.

In this case, the calculation in FIG. 1B is carried out by the DSP calculation process.

Next, the principle of the in-phase component extraction and the quadrature component extraction in FIG. 1 will be explained with reference to FIG. 2 hereunder.

Figure 2:
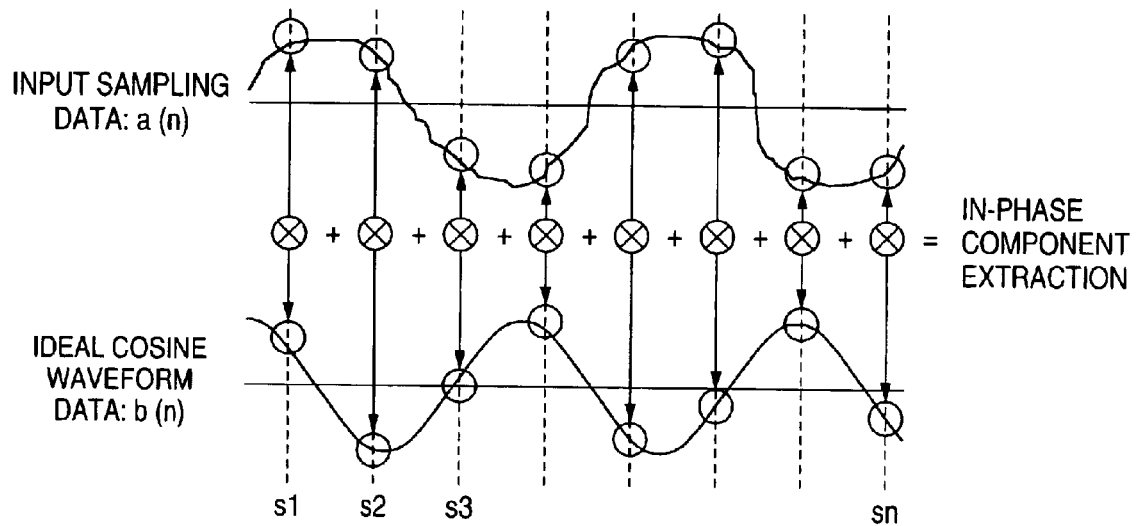
FIG. 2 is a conceptual graph for explaining the principle of in-phase component (quadrature component) extraction in the present invention.

FIG. 2 is a conceptual view for explaining the principle of the in-phase component extraction in the present invention.

In FIG. 2, a(n) is input sampling data, b(n) is ideal cosine waveform data, and s1, s2 . . . sn are sampling time points.

The input sampling data and the ideal cosine waveform data are sampled at the sampling time points s1, s2 . . . sn, and the correlation value of the input sampling data is calculated, so that a level of the in-phase component (I-axis component) at the frequency can be calculated.

The calculation algorithm is given by

.a(n).b(n)

where a(n): the input sampling data, and b(n): the ideal cosine waveform data.

Then, this calculation corresponds to the extraction of only the particular frequency component in the FFT operation.

The quadrature component (Q-axis component) can also be calculated by providing the ideal sine waveform data in place of the ideal cosine waveform data b(n) in FIG. 2.

Figure 3:
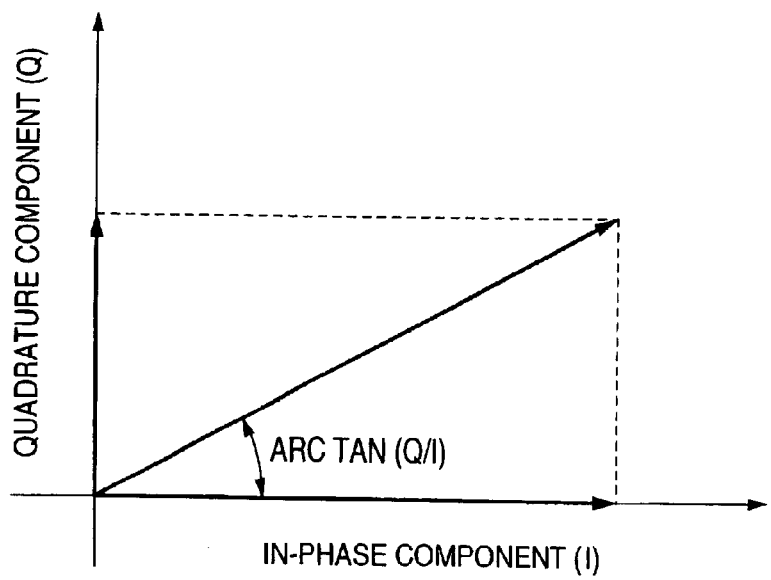
FIG. 3 is a conceptual graph for calculating a phase angle by the arc tan calculation (the transformation from the orthogonal axes to the polar coordinate axes) based on the in-phase component (I) and the quadrature component (Q).
Figure 4A:
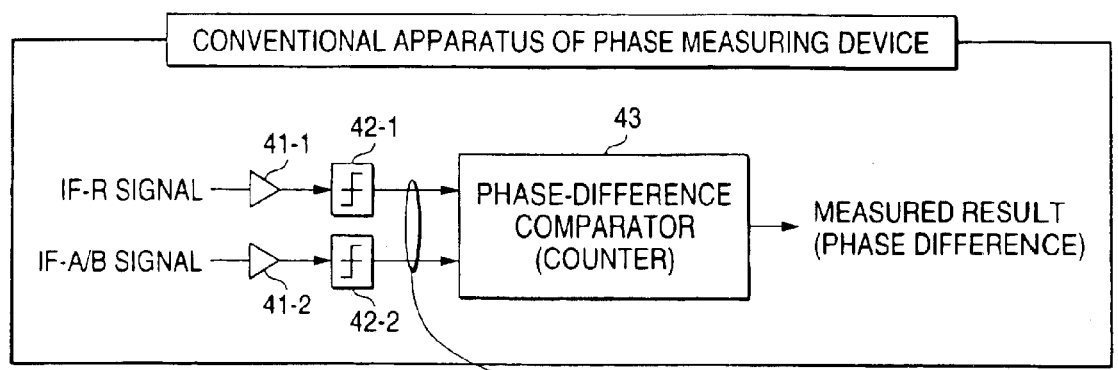
FIGS. 4A and 4B are views for explaining the principle of a phase measuring portion to measure the phase delay characteristic in the prior art.
Figure 4B:
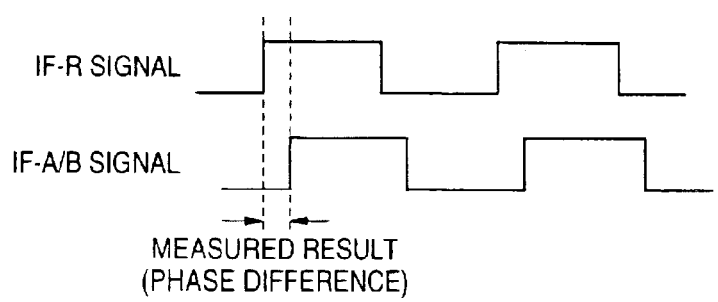
Figure 5:
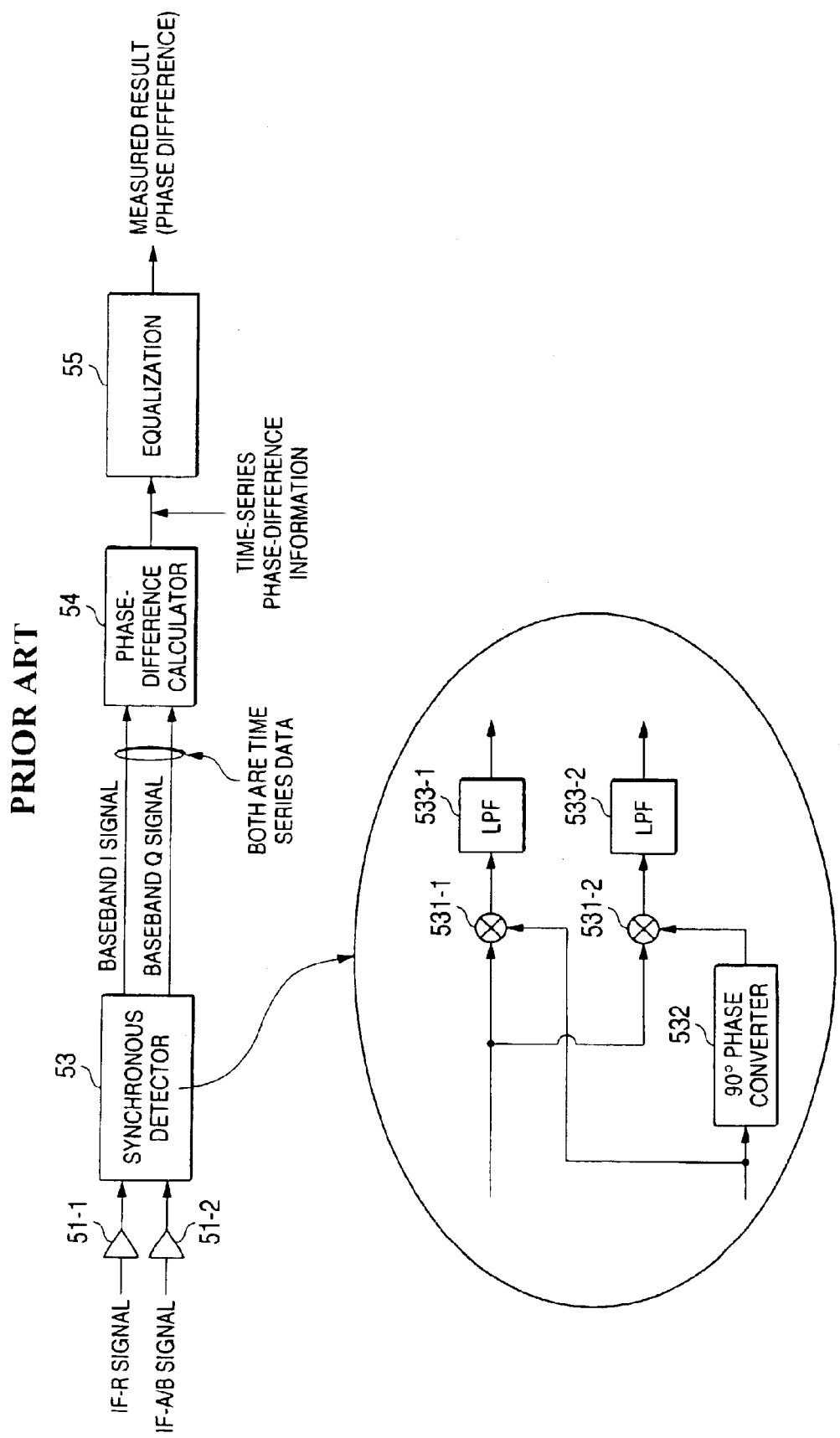
FIG. 5 is a view for explaining the principle of another phase measurement to measure the phase delay characteristic in the prior art.

Then, as shown in FIG. 3, the phase angle of the input sampling data can be calculated by the arc tan calculation (the transformation from the orthogonal aexes to the polar coordinate axes) based on the calculated in-phase component (I) and the calculated quadrature component (Q).

In this manner, since the calculation is carried out by using all sampled data, the phase delay characteristic measuring apparatus of the present invention has not only the same effect as the equalization but also the effect such that this apparatus is strong against the random noise.

Also, the phase delay characteristic measuring apparatus of the present invention has the high resistance against jitter for the same reason.

In addition, since the frequency component that is orthogonal to the IF frequency (the frequency component that is an integral multiple of the sampling frequency/the number of data) becomes zero by the calculation in the present invention, such frequency component seldom exerts an influence upon the calculation result.

For example, since the second harmonic, the third harmonic, . . . of the test frequency come under this condition, the measuring apparatus that has the very high resistance against the harmonic distortion can be constructed.

In order to decide the IF frequency, the sampling frequency, and the sample time, care must be taken in following points.

That is, the input sampling data must be received by m periods (m=integer) of the test signal.

In other words, the IF frequency, the sampling frequency, and the sample time must be decided so as to mate the initial phase (angle) at the time when the sampling is started with the next phase (angle) at the time when the sampling is ended.

If m is not the integer, i.e., if the initial phase (angle) at the time when the sampling is started does not coincide with the next phase (angle) at the time when the sampling is ended, the error because of the Gib's effect is generated during the calculation of the correlation value. Thus, the correct phase difference cannot be calculated.

More particularly, assume that the sampling frequency is fs, the IF frequency is fx, and the sample number (buffer length) is blen, these fs, fx, and blen must be decided such that m=blen .fx/fs is given as the integer.

Here, the clock signals applied to fs and fx must be given as mutually synchronized signals that are generated by using the PLL circuit, or the like based on the same reference clock, for example.

In this case, in the extraction of the in-phase component (I) and the quadrature component (Q), if the reference input signal and the signal whose phase is shifted by 90 from this reference input signal (on DSP) are employed instead of the use of the ideal sine waveform data and the ideal cosine waveform data, the subtraction between the phase values on the virtual coordinate axes can be eliminated.

At the same time, the noise component contained in the original RF oscillation signal can be canceled.

In this manner, according to the present invention, since the arithmetic operation is carried out by the DSP, the calculation can be achieved at high speed at low cost.

Also, if the calculated result of the correlation value is in excess of 13 bit, the measuring accuracy of 0.01 can be attained.

In addition, the higher precision and the higher accuracy can be achieved by selecting the IF frequency, the sampling frequency, and the sample time appropriately.

Further, since the phase is calculated by extracting the measurement frequency component only, the phase delay characteristic measuring apparatus of the present invention is seldom subjected to the influence of other frequency components (the spurious, the distortion, etc.). Therefore, the high-accuracy measurement can be attained even by the low-cost hardware whose performance is relatively low.

As was described above, the present invention provides a phase delay characteristic measuring apparatus for measuring a phase delay of a tested device based on phases of an input signal input into the tested device and an output signal output from the tested device, which comprises an in-phase component calculating means for outputting a correlation value between input sampling data of the input signal and the output signal and ideal sine waveform data as a baseband I signal (in-phase component); a quadrature component calculating means for outputting a correlation value between the input sampling data of the input signal and the output signal and ideal cosine waveform data as a baseband Q signal (quadrature component); a phase angle calculating means for outputting phase angles of the input signal and the output signal based on the baseband I signal (in-phase component) and the baseband Q signal (quadrature component); and a phase delay calculating means for calculating an amount of phase delay of the tested device from the phase angles of the input signal and the output signal.

Therefore, when the phase delay characteristic between the input signal and the output signal of the tested device is measured, the measuring apparatus that can execute the measurement at high speed with high accuracy at low cost without influences of the noise, the spurious, etc. can be provided.

Also, according to the invention, in the in-phase component calculating means and the quadrature component calculating means, a calculation of .a(n).b(n)

where a(n): input sampling data, and b(n): ideal sine waveform data or ideal cosine waveform data is executed by DSP, and samplings of the input signal and the output signal are carried out over m periods (m=integer) respectively. Therefore, since the calculation is carried out by using all sampled data, this not only has the same effect as the equalization but also has the effect that this apparatus is strong against random noise.

Also, according to the invention, a reference input signal and waveform data whose phase is shifted by 90 from the reference input signal by DSP are used in place of the ideal sine waveform data or the ideal cosine waveform data.

Therefore, accumulation of the ideal sine waveform data or the ideal cosine waveform data can be omitted.

Also, according to the invention, the input signal and the output signal, which are to be sampled, are IF signals that are subjected to RF-IF conversion.

Also, the invention provides a phase delay characteristic measuring method of measuring a phase delay of a tested device based on phases of an input signal input into the tested device and an output signal output from the tested device, which comprises an in-phase component calculating step of outputting a correlation value between input sampling data of the input signal and the output signal and ideal sine waveform data as a baseband I signal (in-phase component); a quadrature component calculating step of outputting a correlation value between the input sampling data of the input signal and the output signal and ideal cosine waveform data as a baseband Q signal (quadrature component); a phase angle calculating step of outputting phase angles of the input signal and the output signal based on the baseband I signal (in-phase component) and the baseband Q signal (quadrature component); and a phase delay calculating step of calculating an amount of phase delay of the tested device from the phase angles of the input signal and the output signal. Therefore, when the phase delay characteristic between the input signal and the output signal of the tested device is measured, the measuring method that can execute the measurement at high speed with high accuracy at low cost without the influence of the noise, the spurious, etc. can be implemented.

Also, according to the invention, in the in-phase component calculating step and the quadrature component calculating step, a calculation of .a(n).b(n)

where a(n): input sampling data, and b(n): ideal sine waveform data or ideal cosine waveform data is executed by DSP, and samplings of the input signal and the output signal are carried out over m periods (m=integer) respectively. Therefore, since the calculation is carried out using all sampled data, this not only has the same effect as the equalization but also has the effect that this apparatus is strong against random noise.

As described above, according to the phase delay characteristic measuring apparatus (method) of the present invention, the phase delay characteristic of the tested device can be measured with high precision with a simple configuration without the high-accuracy high-frequency signal source.

Also, even if the hardware that has much phase noise relatively is employed as the test signal generator, the noise can be canceled to some extent by the signal processing algorithm. Therefore, the phase delay characteristic can be measured with high precision by the inexpensive hardware.

In addition, even if the distortion or the harmonic spurious is superposed by the intermediate circuits, the phase delay characteristic can be measured with high precision without the influence of the frequency component that is orthogonal to the frequency of the test signal.

What is claimed is:

1. A phase delay characteristic measuring apparatus for measuring a phase delay of a tested device based on phases of an input signal input into the tested device and an output signal output from the tested device, comprising:

an in-phase component calculating means for outputting a correlation value between input sampling data of the input signal and the output signal and ideal sine waveform data as a baseband I signal (in-phase component);

a quadrature component calculating means for outputting a correlation value between the input sampling data of the input signal and the output signal and ideal cosine waveform data as a baseband Q signal (quadrature component);

a phase angle calculating means for outputting phase angles of the input signal and the output signal based on the baseband I signal (in-phase component) and the baseband Q signal (quadrature component); and a phase delay calculating means for calculating an amount of phase delay of the tested device from the phase angles of the input signal and the output signal.

2. The phase delay characteristic measuring apparatus according to claim 1, wherein, in the in-phase component calculating means and the quadrature component calculating means, a calculation of .a(n).b(n)

where a(n): input sampling data, and b(n): ideal sine waveform data or ideal cosine waveform data is executed by DSP.

3. The phase delay characteristic measuring apparatus according to claim 1, wherein samplings of the input signal and the output signal are carried out over m periods (m=integer) respectively.

4. The phase delay characteristic measuring apparatus according to claim 1, wherein a reference input signal and waveform data whose phase is shifted by 90° from the reference input signal by DSP are used in place of the ideal sine waveform data or the ideal cosine waveform data.

5. The phase delay characteristic measuring apparatus according to claim 1, wherein the input signal and the output signal, which are to be sampled, are IF signals that are subjected to RF-IF conversion.

6. A phase delay characteristic measuring method of measuring a phase delay of a tested device based on phases of an input signal input into the tested device and an output signal output from the tested device, the method comprising:

an in-phase component calculating step of outputting a correlation value between input sampling data of the input signal and the output signal and ideal sine waveform data as a baseband I signal (in-phase component);

a quadrature component calculating step of outputting a correlation value between the input sampling data of the input signal and the output signal and ideal cosine waveform data as a baseband Q signal (quadrature component);

a phase angle calculating step of outputting phase angles of the input signal and the output signal based on the baseband I signal (in-phase component) and the baseband Q signal (quadrature component); and a phase delay calculating step of calculating an amount of phase delay of the tested device from the phase angles of the input signal and the output signal.

7. The phase delay characteristic measuring method according to claim 6, wherein, in the in-phase component calculating step and the quadrature component calculating step, a calculation of .a(n).b(n)

where a(n): input sampling data, and b(n): ideal sine waveform data or ideal cosine waveform data is executed by DSP.

8. The phase delay characteristic measuring method according to claim 6, wherein samplings of the input signal and the output signal are carried out over m periods (m=integer) respectively.

* * * * *